US012738846B2

(12) United States Patent
Cheng et al.

(10) Patent No.: US 12,738,846 B2
(45) Date of Patent: Sep. 15, 2026

(54) POWER SUPPLY AND OPERATING METHOD THEREOF

(71) Applicant: Delta Electronics, Inc., Taoyuan City (TW)

(72) Inventors: Hsieh-Hsiung Cheng, Taoyuan City (TW); Te-Chih Peng, Taoyuan City (TW); Ming-Hsiang Lo, Taoyuan City (TW); Chao-Fong Chang, Taoyuan City (TW)

(73) Assignee: Delta Electronics, Inc., Taoyuan City (TW)

(*) Notice: Subject to any disclaimer, the term of this patent is extended or adjusted under 35 U.S.C. 154(b) by 204 days.

(21) Appl. No.: 18/808,902

(22) Filed: Aug. 19, 2024

(65) Prior Publication Data

US 2025/0357860 A1 Nov. 20, 2025

(30) Foreign Application Priority Data

May 16, 2024 (CN) ........................ 202410607402.1

(51) Int. Cl.

*H02M 3/158* (2006.01)
*H02M 1/00* (2007.01)
*H05K 7/20* (2006.01)

(52) U.S. Cl.

CPC ......... *H02M 3/158* (2013.01); *H02M 1/0016* (2021.05); *H05K 7/20209* (2013.01); *H05K 7/20909* (2013.01)

(58) Field of Classification Search

CPC .... H02M 3/155; H02M 3/158; H02M 1/0003; H02M 1/0006; H02M 1/0016;

(Continued)

(56) References Cited

U.S. PATENT DOCUMENTS

2002/0196606 A1* 12/2002 Hirao ................. G05D 23/1919 361/695
2003/0222505 A1 12/2003 Randall (Continued)

FOREIGN PATENT DOCUMENTS

CN 101018019 A 8/2007
CN 104184348 A 12/2014

(Continued)

OTHER PUBLICATIONS

Chen, Kai-Hui et al., "A new adaptive output voltage controller for fast battery charger," 2017 IEEE Applied Power Electronics Conference and Exposition (APEC), 2017, pp. 3345-3351, doi: 10.1109/APEC.2017.7931176.

(Continued)

*Primary Examiner* — Sisay G Tiku
(74) *Attorney, Agent, or Firm* — KIRTON McCONKIE; Evan R. Witt

(57) ABSTRACT

A power supply is provided. The power supply includes a conversion circuit, an auxiliary power supply circuit, a detection circuit and a control circuit. The conversion circuit generates an output voltage according to an input voltage to power a load. The auxiliary power supply circuit generates an auxiliary voltage according to the input voltage. The control circuit estimates an output power of the power supply. The output power includes a load output power of the conversion circuit and an auxiliary output power of the auxiliary power supply circuit. When at least one of the input voltage, the output power and the environment temperature increases, the control circuit configures the conversion circuit to increase the output voltage correspondingly. When at least one of the input voltage, the output power and the environment temperature decreases, the control circuit con- (Continued)

figures the conversion circuit to decrease the output voltage correspondingly.

14 Claims, 8 Drawing Sheets

(58) Field of Classification Search
CPC ................ H02M 1/327; H02M 1/0048; H05K 7/20209; H05K 7/20909
See application file for complete search history.

(56) References Cited

U.S. PATENT DOCUMENTS

| | | | | |
|---|---|---|---|---|
| 2009/0296432 | A1 | 12/2009 | Chapuis | |
| 2015/0057827 | A1 * | 2/2015 | Uchikawa | G05F 1/66 700/297 |
| 2019/0302821 | A1 * | 10/2019 | Maki | G05F 1/462 |
| 2021/0018947 | A1 * | 1/2021 | Maki | H02P 7/285 |
| 2021/0373586 | A1 * | 12/2021 | Takano | G05F 1/56 |
| 2022/0329161 | A1 | 10/2022 | Tsou et al. | |
| 2024/0128874 | A1 | 4/2024 | Tsou et al. | |
| 2025/0202273 | A1 * | 6/2025 | Hamada | H02J 9/061 |

FOREIGN PATENT DOCUMENTS

| | | | | |
|---|---|---|---|---|
| CN | 112601164 | A | 4/2021 | |
| CN | 113818952 | A | 12/2021 | |
| CN | 116960413 | A | 10/2023 | |
| JP | 2005039917 | A | 2/2005 | |
| JP | 5636729 | B2 | 12/2014 | |
| JP | 2019158779 | A | 9/2019 | |
| TW | 201110541 | A | 3/2011 | |
| TW | 201415189 | A | 4/2014 | |
| TW | I548196 | B | 9/2016 | |
| TW | I662778 | B | 6/2019 | |
| WO | WO-2025196859 | A1 * | 9/2025 | G01F 31/00 |
| WO | WO-2025236230 | A1 * | 11/2025 | H02M 3/156 |

OTHER PUBLICATIONS

Zapater, Marina et al., "Leakage-Aware Cooling Management for Improving Server Energy Efficiency," in IEEE Transactions on Parallel and Distributed Systems, vol. 26, No. 10, pp. 2764-2777, Oct. 1, 2015, doi: 10.1109/TPDS.2014.2361519.

* cited by examiner

POWER SUPPLY AND OPERATING METHOD THEREOF

CROSS-REFERENCE TO RELATED APPLICATION

This application claims priority to China Patent Application No. 202410607402.1 filed on May 16, 2024. The entire contents of the above-mentioned patent application are incorporated herein by reference for all purposes.

FIELD OF THE INVENTION

The present disclosure relates to a power supply and an operating method thereof, and more particularly to the power supply with an adjustable output voltage and the operating method thereof.

BACKGROUND OF THE INVENTION

With the development of science and technology, the demand for electricity continues to increase. Due to the rise of environmental awareness, companies must reduce carbon emissions while increasing electricity consumption, and hence the efficiency requirements for product are constantly increasing.

In a conventional power supply, the output voltage is maintained at a fixed value under different operating conditions. For example, when the input voltage or output power of the power supply changes, the output voltage of the power supply is still maintained at the fixed value. However, maintaining a fixed output voltage makes it difficult for the power supply to keep high efficiency when the operating condition changes.

In addition, apart from supplying power to the load, some components inside the power supply would also consume power, such as heat dissipation devices, power switching components and control circuits. In the past, the power consumed by the above-mentioned components inside the power supply was not considered when calculating the efficiency of the power supply. However, this way of calculating efficiency is not only inaccurate but may also cause the power supply to operate with a low efficiency. For this reason, more and more efficiency specifications consider the power consumed by the components inside the power supply and estimate the efficiency based on the power consumption of the overall power supply system.

Therefore, there is a need of providing a power supply and an operating method thereof in order to overcome the drawbacks of the conventional technologies.

SUMMARY OF THE INVENTION

The present disclosure provides a power supply and an operating method thereof in order to overcome the drawbacks of conventional technologies.

In accordance with an aspect of the present disclosure, a power supply is provided. The power supply includes a conversion circuit, an auxiliary power supply circuit, a detection circuit and a control circuit. The conversion circuit is configured to generate an output voltage according to an input voltage to power a load. The auxiliary power supply circuit is configured to generate an auxiliary voltage according to the input voltage. The detection circuit is configured to measure an environment temperature. The control circuit is coupled to the conversion circuit, the auxiliary power supply circuit and the detection circuit, and is configured to estimate an output power of the power supply. The output power includes a load output power of the conversion circuit and an auxiliary output power of the auxiliary power supply circuit. When at least one of the input voltage, the output power and the environment temperature increases, the control circuit configures the conversion circuit to increase the output voltage correspondingly. When at least one of the input voltage, the output power and the environment temperature decreases, the control circuit configures the conversion circuit to decrease the output voltage correspondingly.

In accordance with another aspect of the present disclosure, an operating method of a power supply is provided. The power supply includes a conversion circuit, an auxiliary power supply circuit, a detection circuit and a control circuit. The control circuit is coupled to the conversion circuit, the auxiliary power supply circuit and the detection circuit. The operating method includes: configuring the conversion circuit to generate an output voltage according to the input voltage to power a load; configuring the auxiliary power supply circuit to generate an auxiliary voltage according to the input voltage; configuring the detection circuit to measure an environment temperature; configuring the control circuit to estimate an output power of the power supply, wherein the output power comprises a load output power of the conversion circuit and an auxiliary output power of the auxiliary power supply circuit; and when at least one of the input voltage, the output power and the environment temperature increases, configuring the conversion circuit to increase the output voltage correspondingly, and when at least one of the input voltage, the output power and the environment temperature decreases, configuring the conversion circuit to decrease the output voltage correspondingly.

In the present disclosure, the output voltage of the power supply is adjusted according to changes in the operating conditions of the power supply, allowing the power supply to maintain high efficiency.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only.

Figure 1:
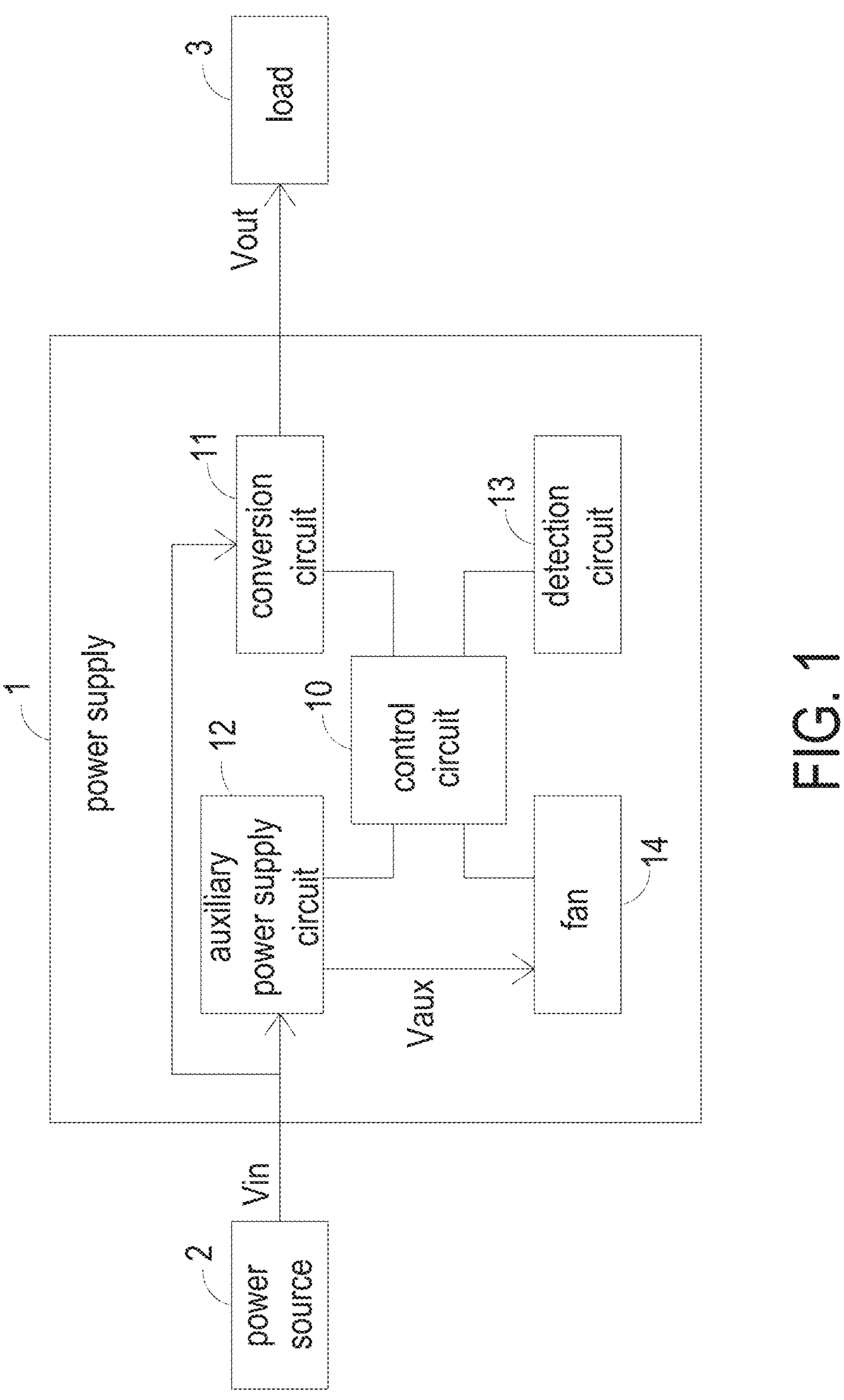
FIG. 1 is a schematic block diagram illustrating a power supply, a power source, and a load according to an embodiment of the present disclosure.

FIG. 1 is a schematic block diagram illustrating a power supply, a power source, and a load according to an embodiment of the present disclosure. As shown in FIG. 1, the power supply 1 receives an input voltage Vin from the power source 2 and converts the input voltage Vin into an output voltage Vout to power the load 3. In this embodiment, the power supply 1 includes a control circuit 10, a conversion circuit 11, an auxiliary power supply circuit 12, a detection circuit 13, and a fan 14. The control circuit 10 is coupled to the conversion circuit 11, the auxiliary power supply circuit 12, the detection circuit 13, and the fan 14. For the sake of brevity, other components of the power supply 1 are not depicted in FIG. 1. In this embodiment, the power supply 1 is divided into the control circuit 10, the conversion circuit 11, the auxiliary power supply circuit 12, the detection circuit 13, and the fan 14 for clearly describing the operation of the power supply 1. The control circuit 10, the conversion circuit 11, the auxiliary power supply circuit 12, and the detection circuit 13 may be implemented by suitable circuit components respectively, or may be integrated into or separately implemented by one or more circuit components. In another embodiment, the function of the control circuit 10, the conversion circuit 11, the auxiliary power supply circuit 12, and the detection circuit 13 may be performed by the same circuit formed by discrete components and/or integrated circuit components. The control circuit 10 may include logic circuitries and is used to control the operation of the conversion circuit 11, the auxiliary power supply circuit 12, the detection circuit 13, and the fan 14. For example, the control circuit 10 configures the conversion circuit 11 to generate the output voltage Vout according to the input voltage Vin, configures the auxiliary power supply circuit 12 to generate an auxiliary voltage Vaux according to the input voltage Vin, and configures the detection circuit 13 to measure an environment temperature of the power supply 1. Additionally, the control circuit 10 also estimates an output power Pout of the power supply 1, and the output power Pout includes a load output power provided by the conversion circuit 11 and an auxiliary output power provided by the auxiliary power supply circuit 12. The conversion circuit 11 may adopt a suitable power conversion architecture, such as a boost conversion circuit, a buck conversion circuit, and a buck-boost conversion circuit, to provide the required output voltage Vout. The auxiliary power supply circuit 12 may adopt a suitable power conversion architecture to provide the required auxiliary voltage Vaux. The auxiliary voltage Vaux is used to supply power for internal components of the power supply 1, such as the fan 14, the control circuit 10, and power switching components. In this embodiment, the detection circuit 13 includes a temperature sensor configured to measure the environment temperature of the power supply 1. The fan 14 is used to dissipate heat from the power supply 1. In another embodiment, the power supply 1 may also adopt one or more of heat dissipation devices including the fan 14, liquid cooling, and immersion cooling.

Figure 2B:
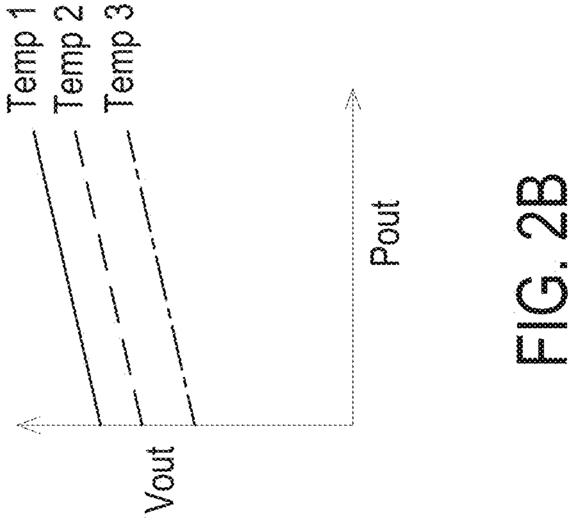
FIG. 2B is a schematic diagram illustrating correlation curves between the output voltage and the output power of the power supply of FIG. 1 under different environment temperatures.
Figure 2A:
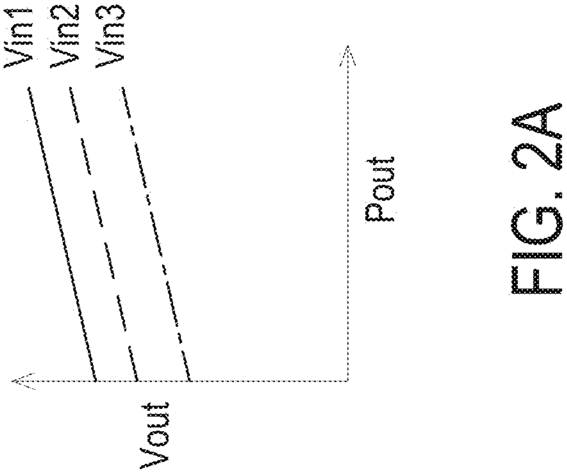
FIG. 2A is a schematic diagram illustrating correlation curves between the output voltage and the output power of the power supply of FIG. 1 under different input voltages.

FIG. 2A is a schematic diagram illustrating correlation curves between the output voltage Vout and the output power Pout of the power supply 1 of FIG. 1 under different input voltages Vin. In FIG. 2A, three correlation curves between the output voltage Vout and the output power Pout under three different input voltages Vin (including a first input voltage Vin1, a second input voltage Vin2, and a third input voltage Vin3) are exemplified. The three correlation curves between the output voltage Vout and the output power Pout under the first input voltage Vin1, the second input voltage Vin2, and the third input voltage Vin3 are depicted by solid lines, dashed lines, and chain-dotted lines, respectively. The first input voltage Vin1 is greater than the second input voltage Vin2, and the second input voltage Vin2 is greater than the third input voltage Vin3. Please refer to FIG. 2A in conjunction with FIG. 1. Under any input voltage Vin, the output voltage Vout rises with an increase in the output power Pout and falls with a decrease in the output power Pout. For example, under any input voltage Vin, when the output power Pout increases, the control circuit 10 configures the conversion circuit 11 to increase the output voltage Vout correspondingly; and conversely, when the output power Pout decreases, the control circuit 10 configures the conversion circuit 11 to decrease the output voltage Vout correspondingly. In addition, under any output power Pout, the output voltage Vout rises with an increase in the input voltage Vin and falls with a decrease in the input voltage Vin. For example, under any output power Pout, when the input voltage Vin increases from the third input voltage Vin3 to the second input voltage Vin2, the control circuit 10 configures the conversion circuit 11 to increase the output voltage Vout correspondingly; and conversely, when the input voltage Vin decreases from the second input voltage Vin2 to the third input voltage Vin3, the control circuit 10 configures the conversion circuit 11 to decrease the output voltage Vout correspondingly. Additionally, in this embodiment, the correlation curves between the output voltage Vout and the output power Pout under different input voltages Vin are all linear and have the same slope. However, the present disclosure is not limited thereto. In another embodiment, the correlation curves between the output voltage Vout and the output power Pout under different input voltages Vin may be linear with different slopes or may be non-linear.

FIG. 2B is a schematic diagram illustrating correlation curves between the output voltage Vout and the output power Pout of the power supply 1 of FIG. 1 under different environment temperatures. In FIG. 2B, three correlation curves between the output voltage Vout and the output power Pout under three different environment temperatures (including a first environment temperature Temp1, a second environment temperature Temp2, and a third environment temperature Temp3) are exemplified. The three correlation curves between the output voltage Vout and the output power Pout under the first environment temperature Temp1, the second environment temperature Temp2, and the third environment temperature Temp3 are depicted by solid lines, dashed lines, and chain-dotted lines, respectively. The first environment temperature Temp1 is higher than the second environment temperature Temp2, and the second environment temperature Temp2 is higher than the third environment temperature Temp3. Please refer to FIG. 2B in conjunction with FIG. 1. Under any environment temperature, the output voltage Vout rises with an increase in the output power Pout and falls with a decrease in the output power Pout. For example, under any environment temperature, when the output power Pout increases, the control circuit 10 configures the conversion circuit 11 to increase the output voltage Vout correspondingly; and conversely, when the output power Pout decreases, the control circuit 10 configures the conversion circuit 11 to decrease the output voltage Vout correspondingly. In addition, under any output power Pout, the output voltage Vout rises with an increase in the environment temperature and falls with a decrease in the environment temperature. For example, under any output power Pout, when the environment temperature increases from the third environment temperature Temp3 to the second environment temperature Temp2, the control circuit 10 configures the conversion circuit 11 to increase the output voltage Vout correspondingly; and conversely, when the environment temperature Temp decreases from the second environment temperature Temp2 to the third environment temperature Temp3, the control circuit 10 configures the conversion circuit 11 to decrease the output voltage Vout correspondingly. Additionally, in this embodiment, the correlation curves between the output voltage Vout and the output power Pout under different environment temperatures are all linear and have the same slope. However, the present disclosure is not limited thereto. In another embodiment, the correlation curves between the output voltage Vout and the output power Pout under different environment temperatures may be linear with different slopes or may be non-linear.

According to FIG. 2A, FIG. 2B and the above description, when at least one of the input voltage Vin, the output power Pout, and the environment temperature increases, the control circuit 10 configures the conversion circuit 11 to increase the output voltage Vout correspondingly. When at least one of the input voltage Vin, the output power Pout, and the environment temperature decreases, the control circuit 10 configures the conversion circuit 11 to decrease the output voltage Vout correspondingly. Consequently, when the operating conditions (including the input voltage Vin, the output power Pout, and the environment temperature) of the power supply 1 change, the control circuit 10 may configure the conversion circuit 11 to adjust the output voltage Vout correspondingly, thereby making the power supply 1 operate with a high efficiency.

Figure 3:
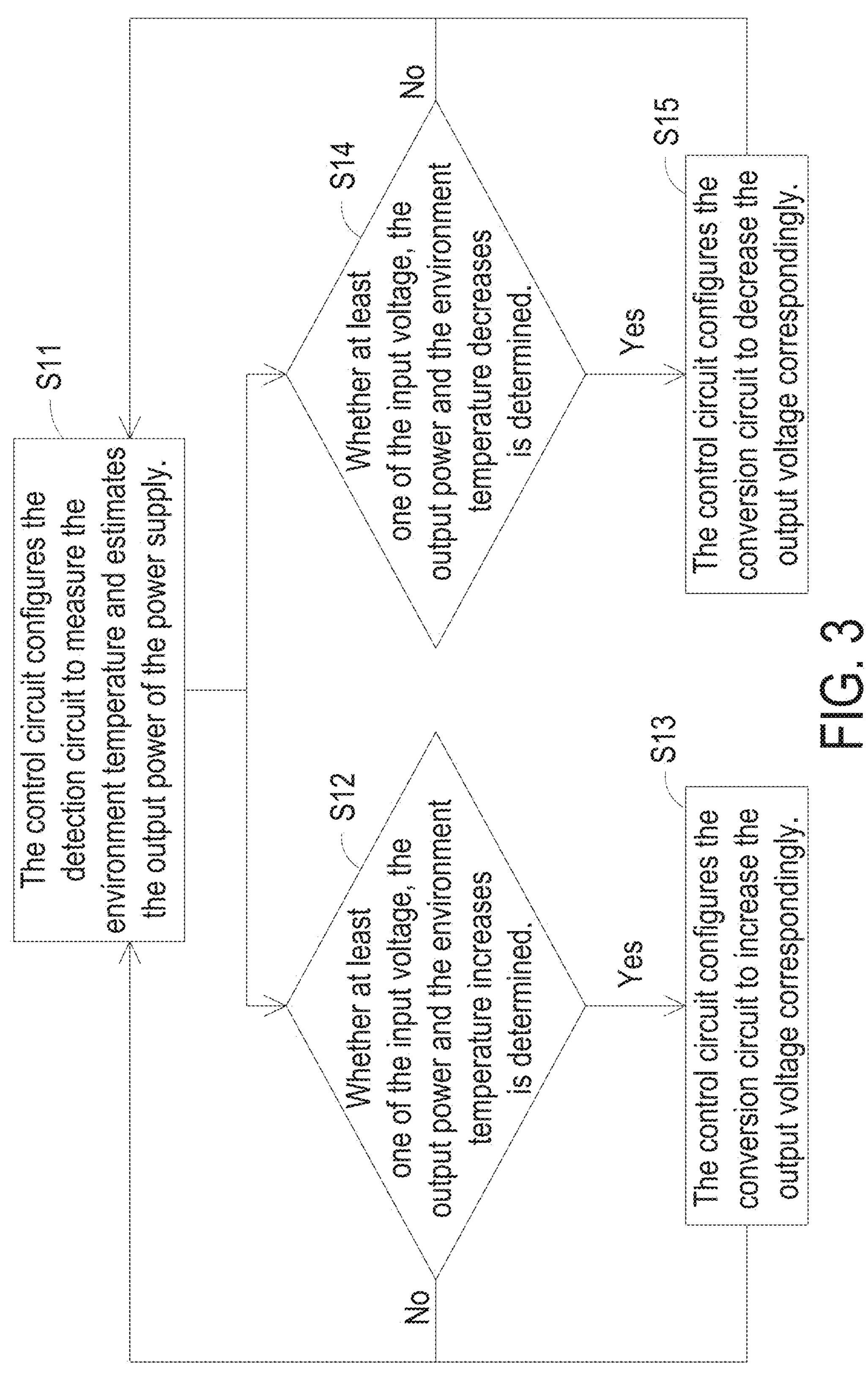
FIG. 3 is a schematic flow chart illustrating a method of adjusting the output voltage of the power supply according to changes in the input voltage, the output power, and the environment temperature of the power supply.

FIG. 3 is a schematic flow chart illustrating a method of adjusting the output voltage Vout of the power supply 1 according to changes in the input voltage Vin, the output power Pout, and the environment temperature. Please refer to FIG. 3 in conjunction with FIG. 1. This method includes the following steps. In step S11, the control circuit 10 configures the detection circuit 13 to measure the environment temperature and estimates the output power Pout of the power supply 1. In step S12, the control circuit 10 determines whether at least one of the input voltage Vin, the output power Pout, and the environment temperature increases. If the determination result of step S12 is negative, step S11 is repeated. Conversely, if the determination result of step S12 is positive, step S13 is performed. In step S13, the control circuit 10 configures the conversion circuit 11 to increase the output voltage Vout correspondingly. After increasing the output voltage Vout by step S13, step S11 is repeated. In step S14, the control circuit 10 determines whether at least one of the input voltage Vin, the output power Pout, and the environment temperature decreases. If the determination result of step S14 is negative, step S11 is repeated. Conversely, if the determination result of step S14 is positive, step S15 is performed. In step S15, the control circuit 10 configures the conversion circuit 11 to decrease the output voltage Vout correspondingly. After decreasing the output voltage Vout by step S15, step S11 is repeated.

In addition, when the operating conditions of the power supply 1 change, an optimal operating point of the internal components of the power supply 1 may also change. Therefore, in the power supply 1 and the operating method thereof of the present disclosure, when the operating conditions change, apart from adjusting the output voltage Vout, the auxiliary voltage Vaux can also be adjusted to make the internal components of the power supply 1 operate at the optimal operating point and to change the operating conditions for making the power supply 1 operate with a high efficiency. In an embodiment, when at least one of the output power Pout and the environment temperature increases, the control circuit 10 configures the auxiliary power supply circuit 12 to increase the auxiliary voltage Vaux correspondingly. Conversely, when at least one of the output power Pout and the environment temperature decreases, the control circuit 10 configures the auxiliary power supply circuit 12 to decrease the auxiliary voltage Vaux correspondingly.

Figure 4:
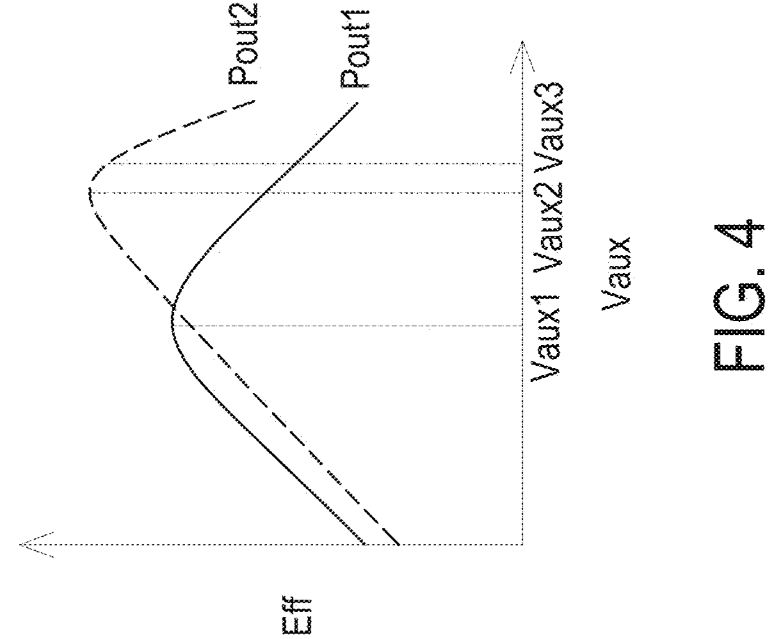
FIG. 4 is a schematic diagram illustrating correlation curves between the efficiency ratio value and the auxiliary voltage of the power supply of FIG. 1.

FIG. 4 is a schematic diagram illustrating correlation curves between the efficiency ratio value Eff and the auxiliary voltage Vaux of the power supply 1 of FIG. 1. The efficiency ratio value Eff is a value of ratio of the output power Pout to the input power Pin of the power supply 1. The output power Pout and input power Pin of the power supply 1 are calculated based on the overall output power and input power of the power supply 1, thereby estimating the efficiency ratio value Eff more accurately and enabling the power supply 1 to operate with a high efficiency. Accordingly, in the embodiment of FIG. 1, the output power Pout of the power supply 1 includes the load output power of the conversion circuit 11 and the auxiliary output power of the auxiliary power supply circuit 12. The input power Pin includes the load input power of the conversion circuit 11 and the auxiliary input power of the auxiliary power supply circuit 12. In FIG. 4, two correlation curves between the efficiency ratio value Eff and the auxiliary voltage Vaux under two different output powers Pout (including a first output power Pout1 and a second output power Pout2) are exemplified. The two correlation curves between the efficiency ratio value Eff and the auxiliary voltage Vaux under the first output power Pout1 and the second output power Pout2 are depicted by solid lines and dashed lines, respectively. Further, in this embodiment, the first output power Pout1 is less than the second output power Pout2. Please refer to FIG. 4 in conjunction with FIG. 1. When the output power Pout increases from the first output power Pout1 to the second output power Pout2, the control circuit 10 configures the auxiliary power supply circuit 12 to correspondingly increase the auxiliary voltage Vaux from a first auxiliary voltage Vaux1 to a second auxiliary voltage Vaux2, so as to maintain the efficiency ratio value Eff of the power supply 1 at an optimal value.

Figure 5:
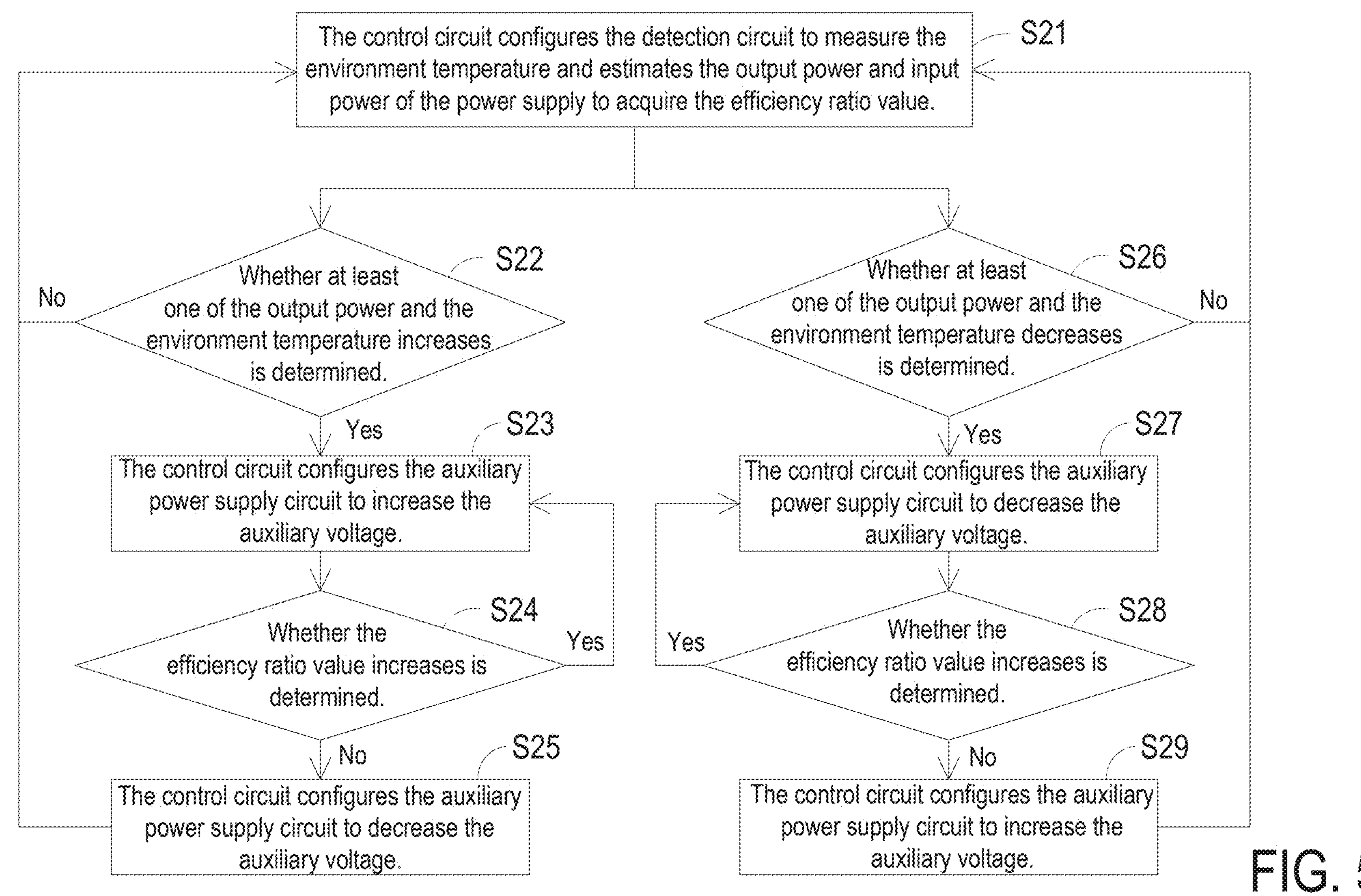
FIG. 5 is a schematic flow chart illustrating a method of adjusting the auxiliary voltage of the power supply according to changes in the output power, the environment temperature, and the efficiency ratio value of the power supply.

In an embodiment, the control circuit 10 estimates the input power Pin of the power supply 1 to acquire the efficiency ratio value Eff of the input power Pin to the output power Pout. During the process of configuring the auxiliary power supply circuit 12 to adjust the auxiliary voltage Vaux, the control circuit 10 monitors changes in the efficiency ratio value Eff for obtain the auxiliary voltage Vaux which maximizes the efficiency ratio value Eff of the power supply 1. FIG. 5 is a schematic flow chart illustrating a method of adjusting the auxiliary voltage Vaux according to changes in the output power Pout, the environment temperature, and the efficiency ratio value Eff of the power supply 1. Please refer to FIG. 5 in conjunction with FIG. 1 and FIG. 4. This method includes the following steps. In step S21, the control circuit 10 configures the detection circuit 13 to measure the environment temperature and estimates the output power Pout and input power Pin of the power supply 1 to acquire the efficiency ratio value Eff. In step S22, the control circuit 10 determines whether at least one of the output power Pout and the environment temperature increases. If the determination result of step S22 is negative, which means that neither the output power Pout nor the environment temperature increases, step S21 is repeated. Conversely, if the result of step S22 is positive, which means that at least one of the output power Pout and the environment temperature increases, step S23 is performed. In step S23, the control circuit 10 configures the auxiliary power supply circuit 12 to increase the auxiliary voltage Vaux. After increasing the auxiliary voltage Vaux, in step S24, the control circuit 10 determines whether the efficiency ratio value Eff increases. If the determination result of step S24 is positive, which means that the efficiency ratio value Eff increases, step S23 is repeated to let the control circuit 10 configure the auxiliary power supply circuit 12 to increase the auxiliary voltage Vaux again. Conversely, if the determination result of step S24 is negative, which means that the efficiency ratio value Eff decreases (as indicated by the correlation curves shown in FIG. 4), step S25 is performed. In step S25, the control circuit 10 configures the auxiliary power supply circuit 12 to decrease the auxiliary voltage Vaux. After performing step S25, step S21 is repeated.

In step S26, the control circuit 10 determines whether at least one of the output power Pout and the environment temperature decreases. If the determination result of step S26 is negative, which means that neither the output power Pout nor the environment temperature decreases, step S21 is repeated. Conversely, if the result of step S26 is positive, which means that at least one of the output power Pout and the environment temperature decreases, step S27 is performed. In step S27, the control circuit 10 configures the auxiliary power supply circuit 12 to decrease the auxiliary voltage Vaux. After decreasing the auxiliary voltage Vaux, in step S28, the control circuit 10 determines whether the efficiency ratio value Eff increases. If the determination result of step S28 is positive, which means that the efficiency ratio value Eff increases, step S27 is repeated to let the control circuit 10 configure the auxiliary power supply circuit 12 to decrease the auxiliary voltage Vaux again. Conversely, if the determination result of step S28 is negative, which means that the efficiency ratio value Eff decreases, step S29 is performed. In step S29, the control circuit 10 configures the auxiliary power supply circuit 12 to increase the auxiliary voltage Vaux. After performing step S29, step S21 is repeated. In an embodiment, when the control circuit 10 configures the auxiliary power supply circuit 12 to increase or decrease the auxiliary voltage Vaux, the auxiliary voltage Vaux is increased or decreased by the same specific margin.

Please refer to FIG. 5 in conjunction with FIG. 4. Taking the situation that the output power Pout increases from the first output power Pout1 to the second output power Pout2 as an example, when employing the method of FIG. 5, the control circuit 10 configures the auxiliary power supply circuit 12 to gradually increase the auxiliary voltage Vaux from the first auxiliary voltage Vaux1 to the second auxiliary voltage Vaux2. During this process, the efficiency ratio value Eff of the power supply 1 also gradually increases. Afterwards, when the control circuit 10 configures the auxiliary power supply circuit 12 to increase the auxiliary voltage Vaux from the second auxiliary voltage Vaux2 to the third auxiliary voltage Vaux3, the efficiency ratio value Eff of the power supply 1 decreases. Therefore, the control circuit 10 configures the auxiliary power supply circuit 12 to decrease the auxiliary voltage Vaux from the third auxiliary voltage Vaux3 back to the second auxiliary voltage Vaux2, thereby making the efficiency ratio value Eff of the power supply 1 reach an optimal value.

Since the aforementioned output power Pout includes the load output power of the conversion circuit 11 and the auxiliary output power of the auxiliary power supply circuit 12, the efficiency estimation in the present disclosure takes the power losses of the components within the power supply 1 (e.g., the fan 14) into consideration. In other words, in the present disclosure, the efficiency is estimated according to the overall power losses of the power supply 1, and correspondingly the output voltage Vout of the conversion circuit 11 and/or the auxiliary voltage Vaux of the auxiliary power supply circuit 12 is adjusted to let the power supply 1 operate with an optimal efficiency.

The way of the control circuit 10 configuring the auxiliary power supply circuit 12 to adjust the auxiliary voltage Vaux may vary according to different design considerations. In an embodiment, the control circuit 10 configures the auxiliary power supply circuit 12 to adjust the auxiliary voltage Vaux to make the efficiency ratio value Eff of the power supply 1 reach an optimal value only when the change in the output power Pout exceeds a power variation threshold. In another embodiment, after the control circuit 10 configures the auxiliary power supply circuit 12 to adjust the auxiliary voltage Vaux, the control circuit 10 configures the auxiliary power supply circuit 12 continues to adjust the auxiliary voltage Vaux if the change in the efficiency ratio value Eff exceeds an efficiency ratio threshold, and the control circuit 10 would not configure the auxiliary power supply circuit 12 continues to adjust the auxiliary voltage Vaux if the change in the efficiency ratio value Eff is less than the efficiency ratio threshold. In further another embodiment, the control circuit 10 continuously configures the auxiliary power supply circuit 12 to adjust the auxiliary voltage Vaux to make the efficiency ratio value Eff of the power supply 1 reach an optimal value.

Please refer to FIG. 1 again. In the power supply 1, the fan 14 is powered by the auxiliary power supply circuit 12, and the rotational speed of the fan 14 is positively correlated with power loss of the fan 14. In an embodiment, when the environment temperature increases, the control circuit 10 configures the fan 14 to increase the rotational speed of the fan 14 to enhance cooling. When the environment temperature decreases, the control circuit 10 configures the fan 14 to decrease the rotational speed of the fan 14 to reduce the power loss of the fan 14. Consequently, the control circuit 10 adjusts the rotational speed of the fan 14 according to changes in the environment temperature, thereby balancing the cooling capability of the fan 14 with the power loss of the fan 14. In an embodiment, the control circuit 10 adjusts the rotational speed of the fan through configuring the auxiliary power supply circuit 12 to adjust the auxiliary voltage Vaux. Specifically, when the environment temperature increases, the control circuit 10 configures the auxiliary power supply circuit 12 to increase the auxiliary voltage Vaux correspondingly, thereby increasing the rotational speed of the fan 14. When the environment temperature decreases, the control circuit 10 configures the auxiliary power supply circuit 12 to decrease the auxiliary voltage Vaux correspondingly, thereby reducing the rotational speed of the fan 14. In another embodiment, the control circuit 10 configures the rotational speed of the fan 14 by configuring the operating time and/or operating frequency of the fan 14 (e.g., using pulse-width modulation signals or pulse-frequency modulation signals). When the environment temperature increases, the control circuit 10 configures the fan 14 to increase the rotational speed; and when the environment temperature decreases, the control circuit 10 configures the fan 14 to decrease the rotational speed.

Figure 6B:
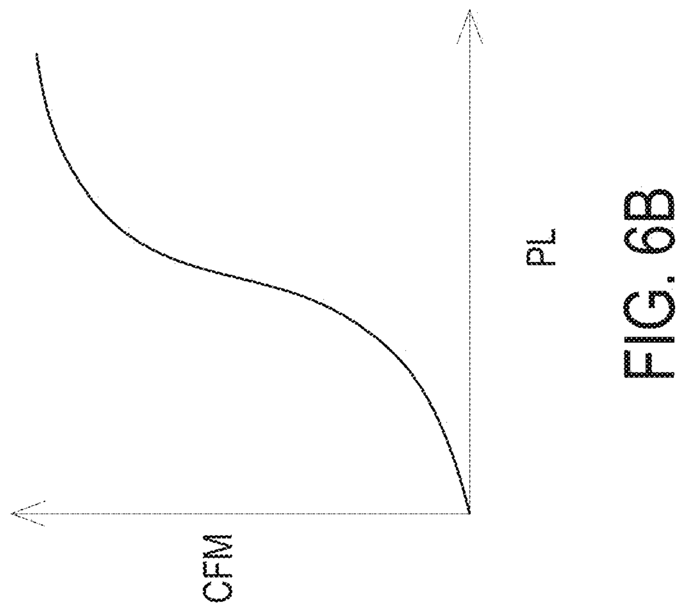
FIG. 6B is a schematic diagram illustrating a correlation curve between the power loss of the fan and the airflow generated by the fan.
Figure 6A:
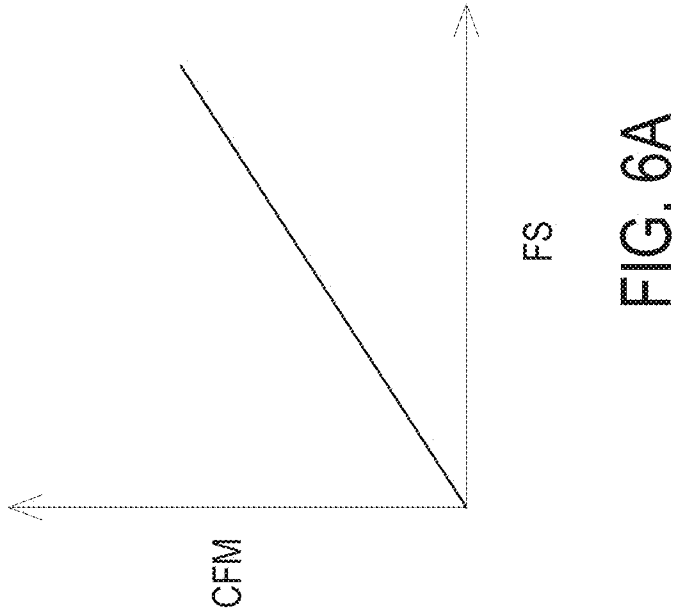
FIG. 6A is a schematic diagram illustrating a correlation curve between the rotational speed of the fan and the airflow generated by the fan.
Figure 6C:
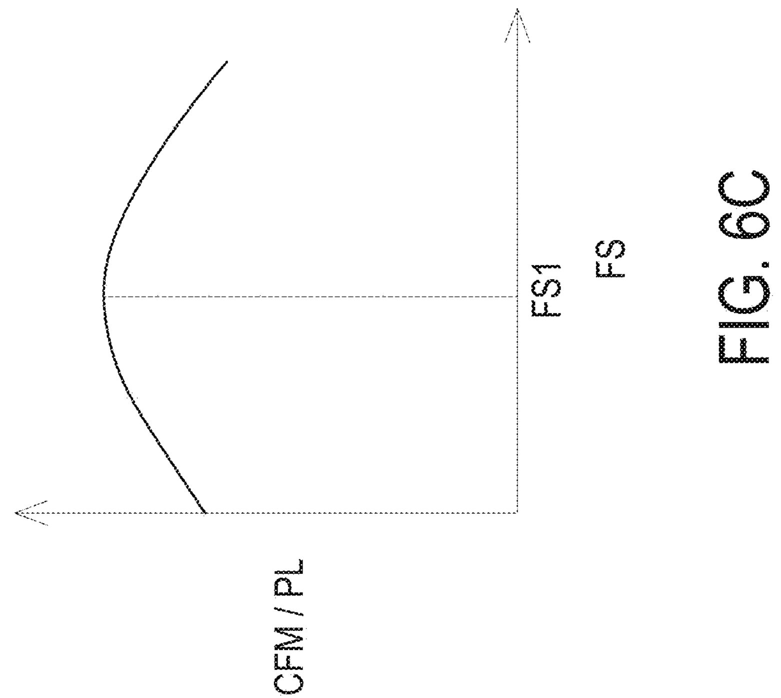
FIG. 6C is a schematic diagram illustrating a correlation curve between the rotational speed and the airflow-to-power ratio value of the fan.

FIG. 6A is a schematic diagram illustrating a correlation curve between the rotational speed FS of the fan 14 and the airflow CFM generated by the fan 14. As shown in FIG. 6A, the rotational speed FS of the fan 14 is positively correlated with the airflow CFM generated by the fan 14, and thus the control circuit 10 may adjust the generated airflow CFM by adjusting the rotational speed FS of the fan 14. FIG. 6B is a schematic diagram illustrating a correlation curve between the power loss PL of the fan 14 and the airflow CFM generated by the fan 14. FIG. 6C is a schematic diagram illustrating a correlation curve between the rotational speed FS and the airflow-to-power ratio value CFM/PL (i.e., the airflow obtained per unit of power loss) of the fan 14, and the correlation curve of FIG. 6C can be obtained by combining FIG. 6A and FIG. 6B. In the embodiment of FIG. 6C, the fan 14 achieves an optimal airflow-to-power ratio value CFM/PL when operating a rotational speed close to the rotational speed FS1. By contrast, due to the basic losses of the motor and internal components of the fan 14, the airflow-to-power ratio value CFM/PL of the fan 14 is low when the fan 14 operates at a rotational speed lower than the rotational speed FS1. Further, due to the increase in coil current, the airflow-to-power ratio value CFM/PL of the fan 14 is also low when the fan 14 operates at a rotational speed higher than the rotational speed FS1. When the fan 14 operates at a rotational speed close to the rotational speed FS1, the fan 14 achieves an optimal airflow-to-power ratio value CFM/PL, which is namely the optimal operating point for the fan 14 to operate with optimal efficiency.

According to the characteristics of the fan 14 shown in FIG. 6C, the fan 14 has different airflow-to-power ratio values CFM/PL when operating at different rotational speeds FS. Therefore, in an embodiment, the control circuit 10 may configure the fan 14 to operate with different rotational speeds during different periods of the duty cycle, thereby maximizing the efficiency ratio value while obtaining the required airflow CFM. For example, the fan 14 has a first airflow-to-power ratio value when operating at a first rotational speed, the fan 14 has a second airflow-to-power ratio value when operating at a second rotational speed, and the first airflow-to-power ratio value is greater than the second airflow-to-power ratio value. During a first time period of the duty cycle, the control circuit 10 configures the fan 14 to operate at the first rotational speed. During a second time period of the duty cycle, the control circuit 10 configures the fan 14 to operate at the second rotational speed. The sum of the airflow during the first time period and the airflow during the second time period can satisfy the cooling demand required by the power supply 1.

Figure 7:
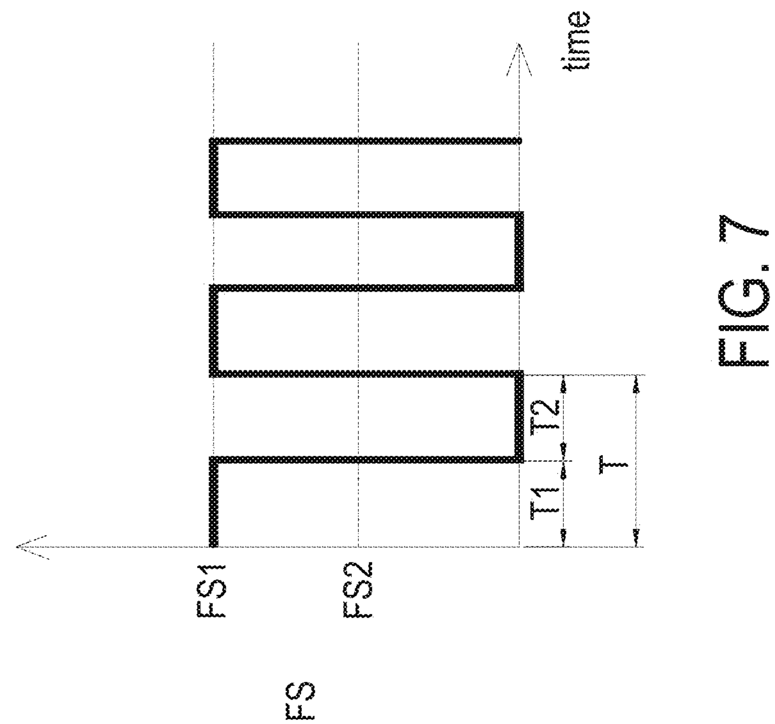
FIG. 7 exemplifies an operation scenario of the fan according to an embodiment of the present disclosure.

FIG. 7 exemplifies an actual operation scenario of the fan 14. As shown in FIG. 7, in this embodiment, during the first time period T1 of the duty cycle T, the control circuit 10 configures the fan 14 to operate at the rotational speed FS1 (i.e., the first rotational speed is the rotational speed FS1). At this time, the fan 14 operates at the optimal operating point and has an optimal airflow-to-power ratio value. During the second time period T2 of the duty cycle T, the control circuit 10 configures the fan 14 to stop operating (i.e., the second rotational speed is zero). Consequently, through configuring the fan 14 to intermittently operate at the optimal operating point by the control circuit 10, the required airflow CFM is generated with low power loss PL, thereby achieving a high efficiency ratio value.

For example, when the required airflow corresponds to the rotational speed FS2 of the fan 14, the control circuit 10 configures the first time period T1 to occupy 50% of the duty cycle T if the rotational speed FS2 is half of the rotational speed FS1. Under this circumstance, the average airflow obtained by the fan 14 intermittently operating at the rotational speed FS1 with a duty cycle of 50% is equal to the airflow obtained by the fan 14 continuously operating at the rotational speed FS2. However, compared to continuously operating at the rotational speed FS2, when the fan 14 intermittently operates at the rotational speed FS1 with a duty cycle of 50%, the power loss PL of the fan 14 is lower, and hence the efficiency ratio value is higher.

In summary, the present disclosure provides a power supply and an operating method thereof in which the output voltage and auxiliary voltage of the power supply is adjusted according to changes in the operating conditions of the power supply, allowing the power supply to maintain high efficiency. In addition, through configuring the fan to operate at different rotational speed during different time periods of the duty cycle, the power loss of the fan can be reduced as much as possible while satisfying the required cooling effect, thereby achieving high efficiency ratio value.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power supply, comprising:

a conversion circuit, configured to generate an output voltage according to an input voltage to power a load;

an auxiliary power supply circuit, configured to generate an auxiliary voltage according to the input voltage;

a detection circuit, configured to measure an environment temperature; and a control circuit, coupled to the conversion circuit, the auxiliary power supply circuit and the detection circuit, and configured to estimate an output power of the power supply, wherein the output power comprises a load output power of the conversion circuit and an auxiliary output power of the auxiliary power supply circuit, wherein when at least one of the input voltage, the output power and the environment temperature increases, the control circuit configures the conversion circuit to increase the output voltage correspondingly, and when at least one of the input voltage, the output power and the environment temperature decreases, the control circuit configures the conversion circuit to decrease the output voltage correspondingly, wherein the control circuit estimates an input power of the power supply; the control circuit configures the auxiliary power supply circuit to increase the auxiliary voltage;

when an efficiency ratio value of the output power to the input power increases after the auxiliary voltage is increased, the control circuit configures the auxiliary power supply circuit to increase the auxiliary voltage again; and when the efficiency ratio value decreases after the auxiliary voltage is increased, the control circuit configures the auxiliary power supply circuit to decrease the auxiliary voltage.

2. The power supply according to claim 1, wherein when at least one of the output power and the environment temperature increases, the control circuit configures the auxiliary power supply circuit to increase the auxiliary voltage correspondingly; and when at least one of the output power and the environment temperature decreases, the control circuit configures the auxiliary power supply circuit to decrease the auxiliary voltage correspondingly.

3. The power supply according to claim 2, wherein the control circuit configures the auxiliary power supply circuit to decrease the auxiliary voltage; when the efficiency ratio value of the output power to the input power increases after the auxiliary voltage is decreased, the control circuit configures the auxiliary power supply circuit to decrease the auxiliary voltage again; and when an the efficiency ratio value decreases after the auxiliary voltage is decreased, the control circuit configures the auxiliary power supply circuit to increase the auxiliary voltage.

4. The power supply according to claim 1, further comprising a fan powered by the auxiliary power supply circuit, wherein the control circuit configures the fan to increase a rotational speed of the fan when the environment temperature increases, and the control circuit configures the fan to decrease the rotational speed of the fan when the environment temperature decreases.

5. The power supply according to claim 4, wherein the fan has a first airflow-to-power ratio value when operating at a first rotational speed, the fan has a second airflow-to-power ratio value when operating at a second rotational speed, and the first airflow-to-power ratio value is greater than the second airflow-to-power ratio value; during a first time period of a duty cycle, the control circuit configures the fan to operate at the first rotational speed; and during a second time period of the duty cycle, the control circuit configures the fan to operate at the second rotational speed.

6. The power supply according to claim 4, wherein when the environment temperature increases, the control circuit configures the auxiliary power supply circuit to increase the auxiliary voltage correspondingly for increasing the rotational speed of the fan, and when the environment temperature decreases, the control circuit configures the auxiliary power supply circuit to decrease the auxiliary voltage correspondingly for decreasing the rotational speed of the fan.

7. The power supply according to claim 6, wherein the fan has a first airflow-to-power ratio value when operating at a first rotational speed, the fan has a second airflow-to-power ratio value when operating at a second rotational speed, and the first airflow-to-power ratio value is greater than the second airflow-to-power ratio value; during a first time period of a duty cycle, the control circuit configures the fan to operate at the first rotational speed by configuring the auxiliary power supply circuit; and during a second time period of the duty cycle, the control circuit configures the fan to operate at the second rotational speed by configuring the auxiliary power supply circuit.

8. An operating method of a power supply, wherein the power supply comprises a conversion circuit, an auxiliary power supply circuit, a detection circuit and a control circuit, the control circuit is coupled to the conversion circuit, the auxiliary power supply circuit and the detection circuit, and the operating method comprises:

configuring the conversion circuit to generate an output voltage according to the input voltage to power a load;

configuring the auxiliary power supply circuit to generate an auxiliary voltage according to the input voltage;

configuring the detection circuit to measure an environment temperature;

configuring the control circuit to estimate an output power of the power supply, wherein the output power comprises a load output power of the conversion circuit and an auxiliary output power of the auxiliary power supply circuit; and when at least one of the input voltage, the output power and the environment temperature increases, configuring the conversion circuit to increase the output voltage correspondingly, and when at least one of the input voltage, the output power and the environment temperature decreases, configuring the conversion circuit to decrease the output voltage correspondingly, wherein the operating method further comprises: configuring the control circuit to estimate an input power of the power supply;

configuring the auxiliary power supply circuit to increase the auxiliary voltage;

when an efficiency ratio value of the output power to the input power increases after the auxiliary voltage is increased, configuring the auxiliary power supply circuit to increase the auxiliary voltage again; and when the efficiency ratio value decreases after the auxiliary voltage is increased, configuring the auxiliary power supply circuit to decrease the auxiliary voltage.

9. The operating method according to claim 8, further comprising:

when at least one of the output power and the environment temperature increases, configuring the auxiliary power supply circuit to increase the auxiliary voltage correspondingly; and when at least one of the output power and the environment temperature decreases, configuring the auxiliary power supply circuit to decrease the auxiliary voltage correspondingly.

10. The operating method according to claim 9, further comprising:

configuring the control circuit to estimate an input power of the power supply;

configuring the auxiliary power supply circuit to decrease the auxiliary voltage;

when the efficiency ratio value of the output power to the input power increases after the auxiliary voltage is decreased, configuring the auxiliary power supply circuit to decrease the auxiliary voltage again; and when the efficiency ratio value decreases after the auxiliary voltage is decreased, configuring the auxiliary power supply circuit to increase the auxiliary voltage.

11. The operating method according to claim 8, further comprising:

configuring a fan powered by the auxiliary power supply circuit; and configuring the fan to increase a rotational speed of the fan when the environment temperature increases, and configuring the fan to decrease the rotational speed of the fan when the environment temperature decreases.

12. The operating method according to claim 11, wherein the fan has a first airflow-to-power ratio value when operating at a first rotational speed, the fan has a second airflow-to-power ratio value when operating at a second rotational speed, the first airflow-to-power ratio value is greater than the second airflow-to-power ratio value, and the operating method further comprises:

during a first time period of a duty cycle, configuring the fan to operate at the first rotational speed; and during a second time period of the duty cycle, configuring the fan to operate at the second rotational speed.

13. The operating method according to claim 11, wherein when the environment temperature increases, the rotational speed of the fan is increased by configuring the auxiliary power supply circuit to increase the auxiliary voltage correspondingly, and when the environment temperature decreases, the rotational speed of the fan is decreased by configuring the auxiliary power supply circuit to decrease the auxiliary voltage correspondingly.

14. The operating method according to claim 13, wherein the fan has a first airflow-to-power ratio value when operating at a first rotational speed, the fan has a second airflow-to-power ratio value when operating at a second rotational speed, the first airflow-to-power ratio value is greater than the second airflow-to-power ratio value, and the operating method further comprises:

during a first time period of a duty cycle, configuring the fan to operate at the first rotational speed by configuring the auxiliary power supply circuit; and during a second time period of the duty cycle, configuring the fan to operate at the second rotational speed by configuring the auxiliary power supply circuit.

* * * * *